(12) United States Patent
Roehner et al.

(10) Patent No.: US 10,446,534 B2
(45) Date of Patent: Oct. 15, 2019

(54) CAPACITORS IN INTEGRATED CIRCUITS AND METHODS OF FABRICATION THEREOF

(71) Applicant: Infineon Technologies AG, Neubiberg (DE)

(72) Inventors: Michael Roehner, Munich (DE); Stefano Aresu, Munich (DE)

(73) Assignee: Infineon Technologies AG, Neubiberg (DE)

( * ) Notice: Subject to any disclaimer, the term of this patent is extended or adjusted under 35 U.S.C. 154(b) by 341 days.

(21) Appl. No.: 15/294,698

(22) Filed: Oct. 15, 2016

(65) Prior Publication Data

US 2017/0033095 A1  Feb. 2, 2017

Related U.S. Application Data

(62) Division of application No. 13/798,898, filed on Mar. 13, 2013, now Pat. No. 9,508,788.

(51) Int. Cl.
| | |
|---|---|
| *H01L 27/01* | (2006.01) |
| *H01L 49/02* | (2006.01) |
| *H01L 23/522* | (2006.01) |
| *H01L 21/70* | (2006.01) |

(52) U.S. Cl.
CPC .......... *H01L 27/016* (2013.01); *H01L 21/707* (2013.01); *H01L 23/5223* (2013.01); *H01L 28/20* (2013.01); *H01L 28/40* (2013.01); *H01L 28/60* (2013.01); *H01L 23/5228* (2013.01); *H01L 2924/0002* (2013.01)

(58) Field of Classification Search
CPC ...................................................... H01L 27/01
See application file for complete search history.

(56) References Cited

U.S. PATENT DOCUMENTS

| | | | |
|---|---|---|---|
| 5,801,412 | A | 9/1998 | Tobita |
| 7,385,241 | B2 | 6/2008 | Choi |
| 2003/0161128 | A1 | 8/2003 | Masuda |
| 2007/0296013 | A1 | 12/2007 | Chang et al. |
| 2008/0283889 | A1 | 11/2008 | Haraguchi et al. |
| 2009/0014832 | A1 | 1/2009 | Baumgartner et al. |
| 2009/0141424 | A1 | 6/2009 | Barth et al. |
| 2010/0065944 | A1 | 3/2010 | Tu et al. |
| 2012/0104552 | A1 | 5/2012 | Kim et al. |
| 2012/0119326 | A1 | 5/2012 | Sugisaki et al. |

(Continued)

FOREIGN PATENT DOCUMENTS

| | | |
|---|---|---|
| CN | 1151613 A | 6/1997 |
| CN | 101672900 A | 3/2010 |

(Continued)

*Primary Examiner* — Marvin Payen
(74) *Attorney, Agent, or Firm* — Slater Matsil, LLP

(57) ABSTRACT

In one embodiment, a capacitor includes a first row including a first capacitor element and a second capacitor element coupled in parallel, and a second row including a third capacitor element and a fourth capacitor element coupled in parallel. The first row is coupled in series with the second row. In a metallization level over a workpiece, the second capacitor element is disposed between the first capacitor element and the third capacitor element. In the metallization level, the third capacitor element is disposed between the second capacitor element and the fourth capacitor element. The first, the second, the third, and the fourth capacitor elements are disposed in the metallization level.

12 Claims, 12 Drawing Sheets

(56) References Cited

U.S. PATENT DOCUMENTS

2012/0286393 A1 11/2012 Lin et al.
2013/0049086 A1 2/2013 Ahn et al.

FOREIGN PATENT DOCUMENTS

| DE | 102004047571 A1 | 5/2005 |
| DE | 102005056906 B4 | 5/2007 |
| WO | 2012065229 A1 | 5/2012 |

| | $C \;{=}\!{=}$ | (two capacitors in parallel, each C) | (n capacitors in parallel, $2C/n$ each, $C_1, C_2, \ldots C_n$) |
|---|---|---|---|
| capacitance w/o breakdown | C | C | C |
| capacitance with breakdown | short | $C/2 + C = 1.5C$ | $(n-1)C/n + 2C/n = (n+1)C/n$ |
| failure probability | p | $2*p*p$ | $2*p/n*p/n*n = 4p^2/n$ |

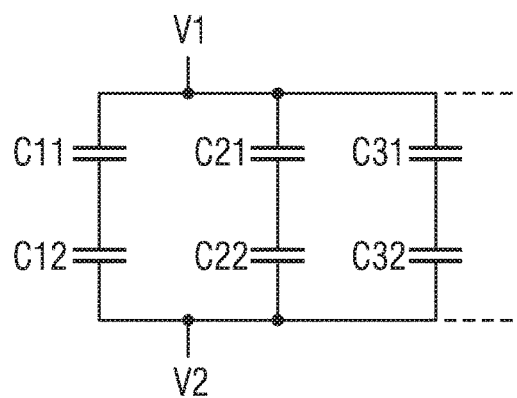
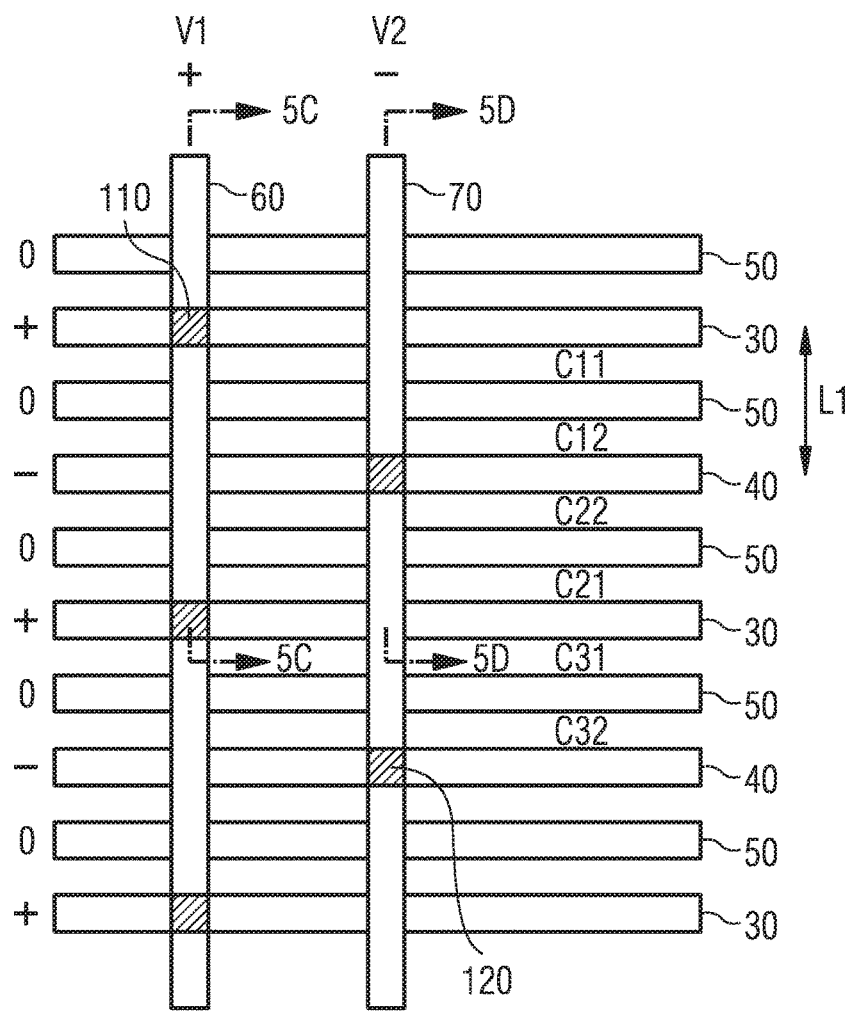

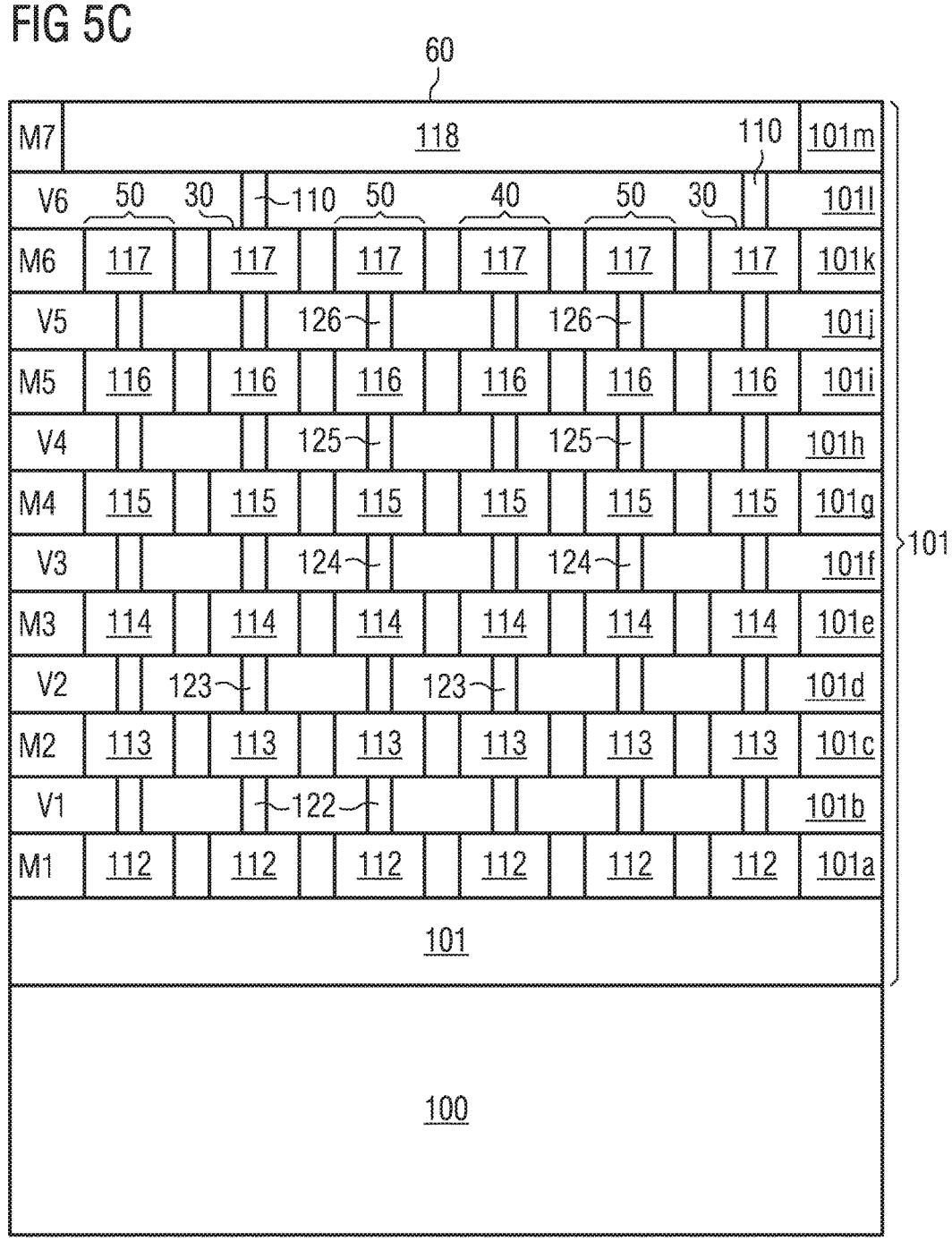

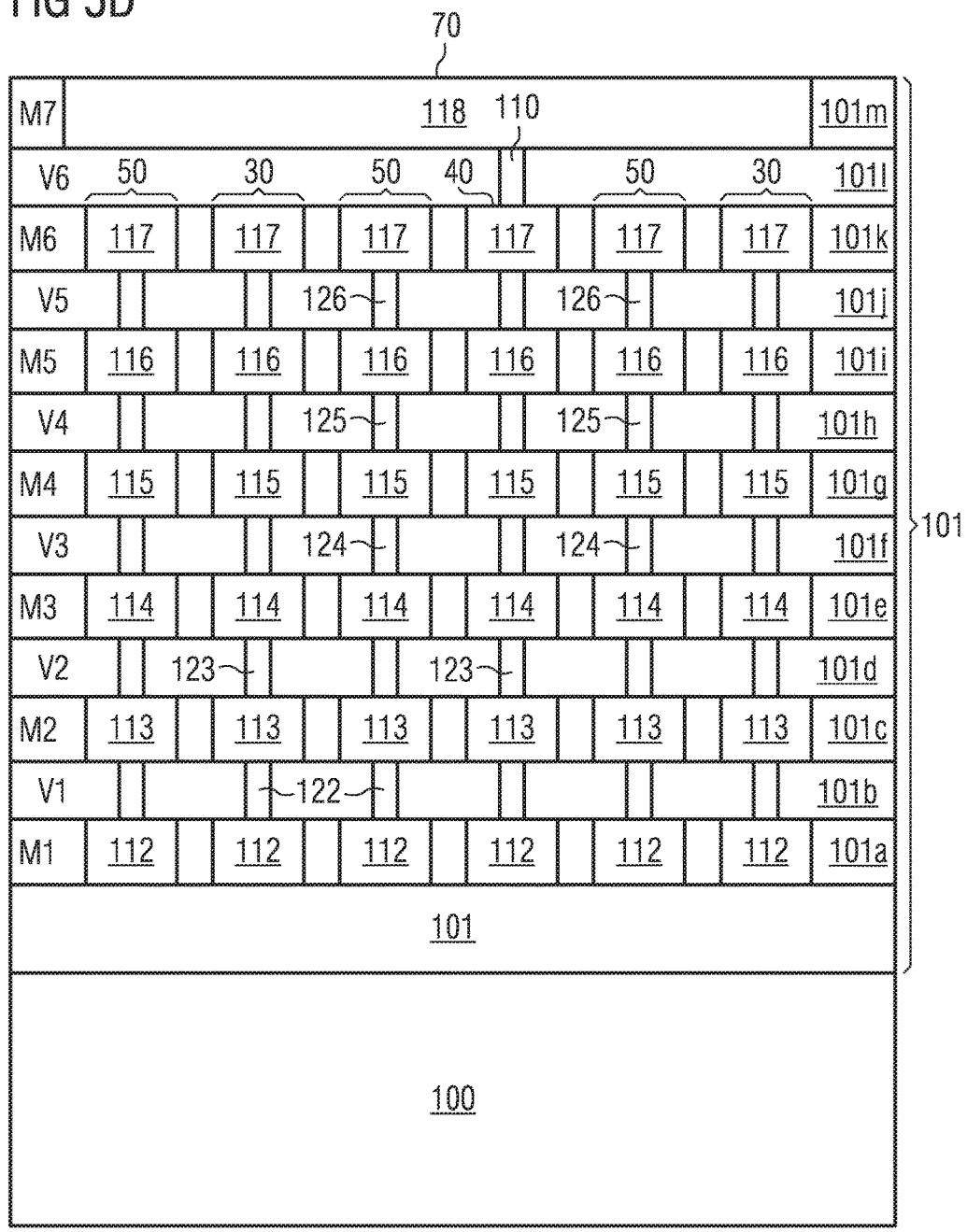

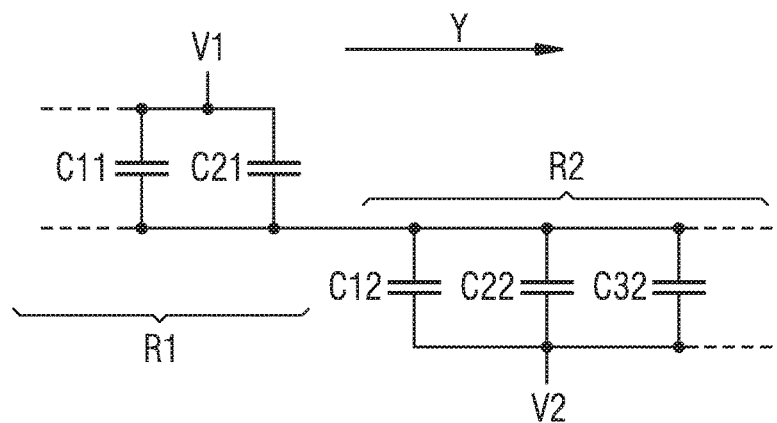
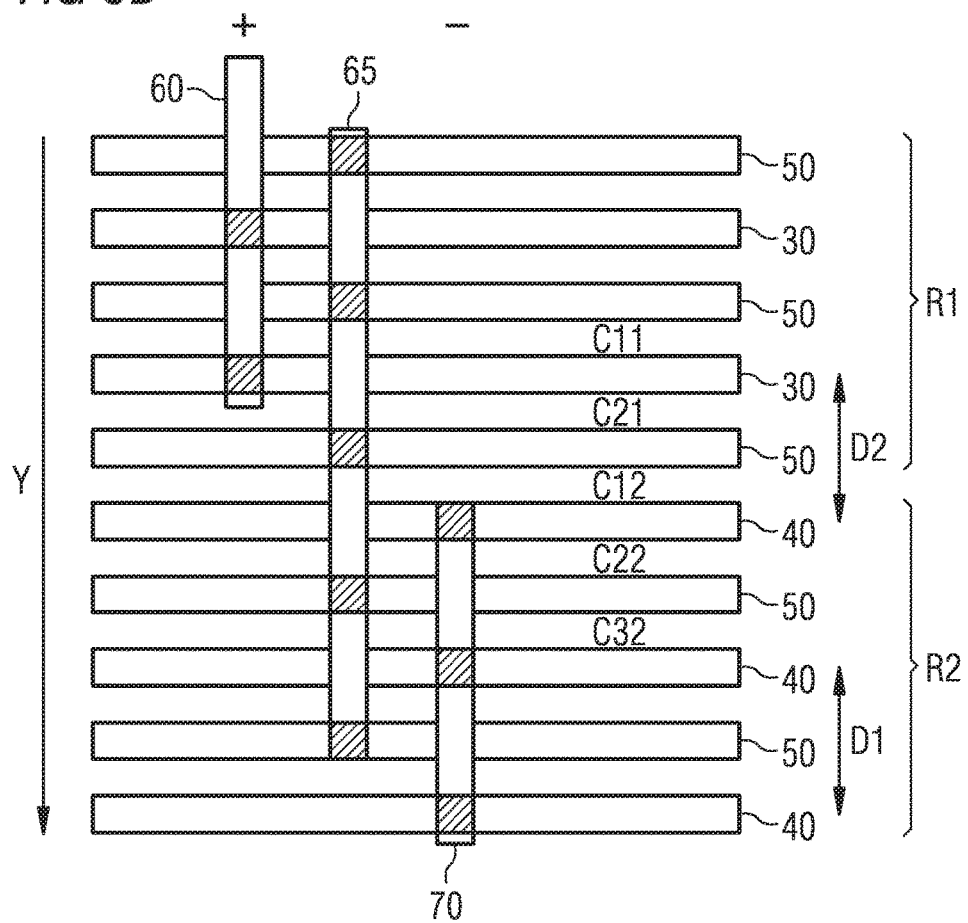

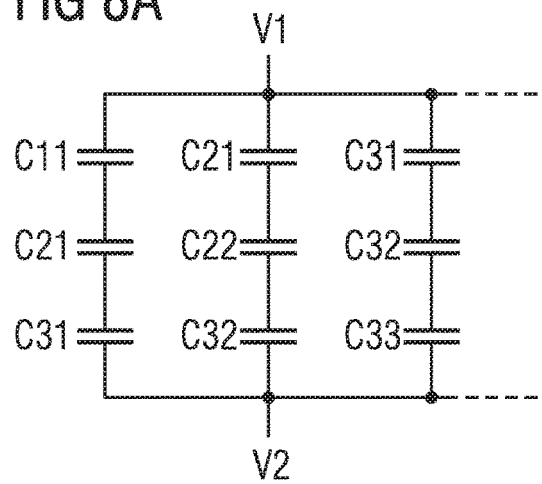
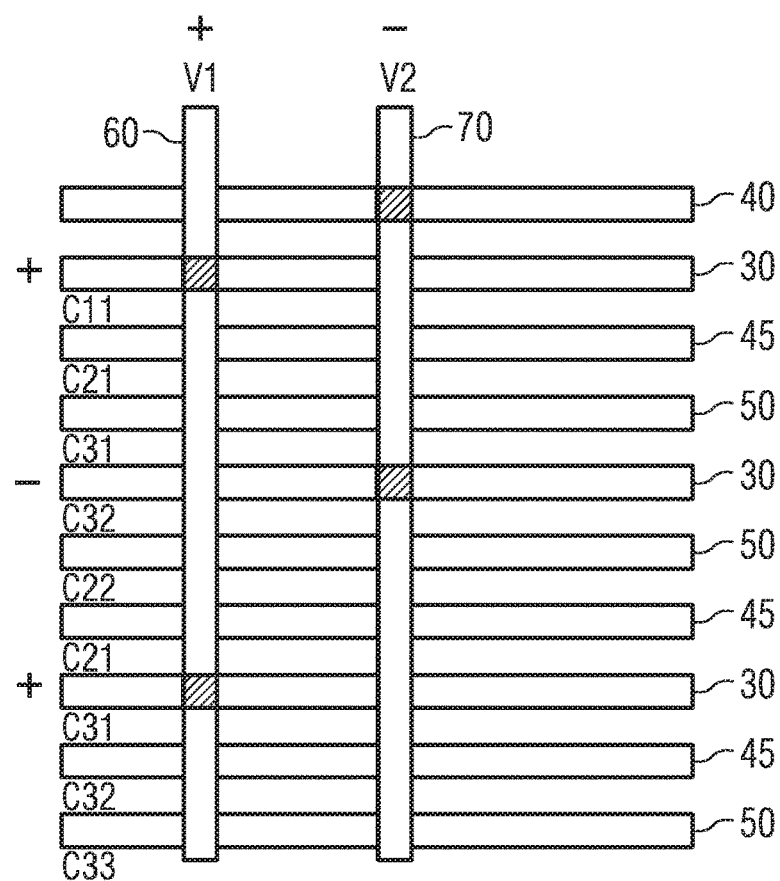

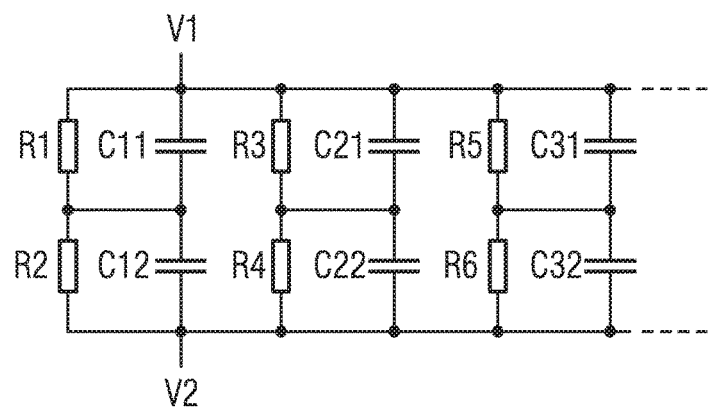
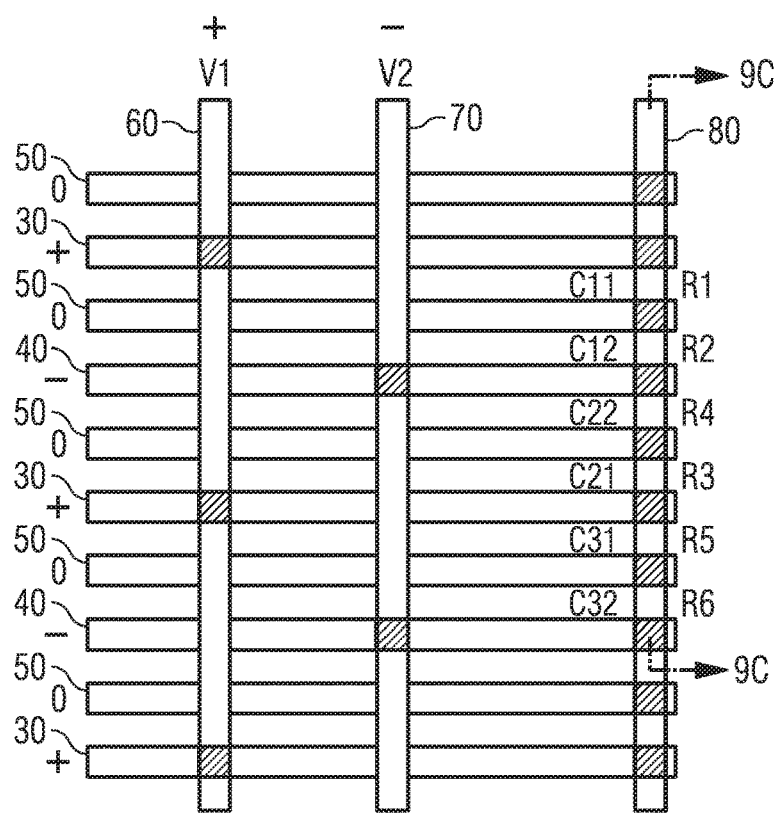

CAPACITORS IN INTEGRATED CIRCUITS AND METHODS OF FABRICATION THEREOF

CROSS-REFERENCE TO RELATED APPLICATIONS

This application is a division of U.S. patent application Ser. No. 13/798,898, filed on Mar. 13, 2013 (now U.S. Pat. No. 9,508,788, issued on Nov. 29, 2016), which application is hereby incorporated herein by reference.

TECHNICAL FIELD

The present invention relates generally to semiconductor devices, and more particularly to capacitors in integrated circuits and methods of fabrication thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Capacitors are elements that are used in semiconductor devices for storing an electrical charge. Capacitors comprise two conductive plates separated by an insulating material. When an electric current is applied to a capacitor, electric charges of equal magnitude yet opposite polarity build up on the capacitor plates. The capacitance, or the amount of charge held by the capacitor per applied voltage, depends on a number of parameters, such as the area of the plates, the distance between the plates, and the dielectric constant value of the insulating material between the plates, as examples. Capacitors are used in applications such as electronic filters, analog-to-digital converters, memory devices, control applications, and many other types of semiconductor device applications.

SUMMARY

In accordance with an embodiment of the present invention, a method of making a capacitor array comprises forming a first column comprising a first capacitor element and a second capacitor element coupled in series. The method further comprises forming a second column comprising a third capacitor element and a fourth capacitor element coupled in series. The first column is coupled in parallel with the second column. The second capacitor element is disposed between the first capacitor element and the fourth capacitor element within a metallization level. The fourth capacitor element is disposed between the second capacitor element and the third capacitor element within the metallization level.

In an alternative embodiment of the present invention, a method of making a device comprises providing a first circuit design including a single capacitor having a first capacitance and a first area, and generating a second circuit design by replacing the single capacitor with a capacitor array. The capacitor array comprises a plurality of columns comprising capacitor elements in series. The plurality of columns is coupled in parallel to form a plurality of rows. The capacitance of each capacitor element in the plurality of columns has a value equal or smaller than the value of the first capacitance. Each capacitor element in the plurality of columns has an area less than the first area. The method further includes fabricating a circuit with the second circuit design comprising the capacitor array in a metallization layer over a workpiece.

In another alternative embodiment of the present invention, a method of making a device comprises providing a first circuit design including a single capacitor having a first capacitance, and generating a second circuit design by replacing the single capacitor with a capacitor array. The capacitor array comprises a plurality of columns comprising capacitor elements in series. The plurality of columns is coupled in parallel to form a plurality of rows. The capacitance of each capacitor element in the plurality of columns has a value of the first capacitance multiplied by a scaling ratio. The scaling ratio is a total number of elements in a column in the plurality of columns divided by a total number of elements in a row in the plurality of rows. The method further includes fabricating a circuit with the second circuit design comprising the capacitor array in a metallization layer over a workpiece.

In an alternative embodiment of the present invention, a method of making a device comprising providing a first circuit design including a single capacitor having a first capacitance, and generating a second circuit design by replacing the single capacitor with a capacitor array having the first capacitance. The capacitor array comprises a first column comprising a first capacitor element and a second capacitor element coupled in series, and a second column comprising a third capacitor element and a fourth capacitor element coupled in series. The first column is coupled in parallel with the second column. The method further comprises fabricating a circuit with the second circuit design comprising the capacitor array over a workpiece. The first, the second, the third, and the fourth capacitor elements are disposed in a same metallization layer. The second capacitor element is disposed between the first capacitor element and the fourth capacitor element within a metallization level. The fourth capacitor element is disposed between the second capacitor element and the third capacitor element within the metallization level.

In an another alternative embodiment of the present invention, a capacitor comprises a first row comprising a first capacitor element and a second capacitor element coupled in parallel, and a second row comprising a third capacitor element and a fourth capacitor element coupled in parallel. The first row is coupled in series with the second row. In a metallization level over a workpiece, the second capacitor element is disposed between the first capacitor element and the third capacitor element. In the metallization level, the third capacitor element is disposed between the second capacitor element and the fourth capacitor element. The first, the second, the third, and the fourth capacitor elements are disposed in the metallization level.

In yet another alternative embodiment of the present invention, a capacitor comprises a first conductive line oriented along a first direction disposed over a substrate in a first metal level, and a second conductive line oriented along the first direction disposed over the substrate in the first metal level. The second conductive line is capacitively coupled to the first conductive line. A third conductive line is oriented along the first direction disposed over the substrate in the first metal level. The second conductive line is disposed between the first and the third conductive lines. A first perpendicular conductive line is oriented along a second direction disposed in a second metal level over the first metal level. The first conductive line is coupled to the first perpendicular conductive line. The first direction is perpendicular to the second direction. A second perpendicular conductive line is oriented along the second direction disposed in the second metal level. The second perpendicular conductive line is coupled to the third conductive line. The first perpendicular conductive line is coupled to a first potential node, and the second perpendicular conductive line is coupled to a second potential node.

BRIEF DESCRIPTION OF THE DRAWINGS

For a more complete understanding of the present invention, and the advantages thereof, reference is now made to the following descriptions taken in conjunction with the accompanying drawing, in which:

FIG. 2, which includes

FIG. 5, which includes FIGS. 5A-5D, illustrates a capacitor array illustrating a multi-dimensional array in accordance with an embodiment of the present invention, wherein FIG. 5A illustrates a circuit layout, wherein FIG. 5B illustrates a top view of the capacitor array, and wherein FIGS. 5C and 5D illustrate cross-sectional views of the capacitor array;

FIG. 6, which includes FIGS. 6A-6B, illustrates a capacitor array illustrating locally separated capacitors within a series circuit in accordance with an alternative embodiment of the present invention, wherein FIG. 6A illustrates a schematic layout and FIG. 6B illustrates a top view;

FIG. 7, which includes FIGS. 7A-7B, illustrates a capacitor array illustrating both pixeling and locally separated capacitors within a series circuit in accordance with an alternative embodiment of the present invention, wherein FIG. 7A illustrates a schematic layout and FIG. 7B illustrates a top view;

FIG. 8, which includes FIGS. 8A-8B, illustrates a capacitor array illustrating more than two capacitors in series in accordance with an alternative embodiment of the present invention, wherein FIG. 8A illustrates a schematic layout and FIG. 8B illustrates a top view;

FIG. 9, which includes FIGS. 9A-9C, illustrates a capacitor array illustrating clamping of the floating potential in accordance with an alternative embodiment of the present invention, wherein FIG. 9A illustrates a schematic layout, FIG. 9B illustrates a top view, and FIG. 9C illustrates a cross-sectional view;

FIG. 10, which includes FIGS. 10A-10C, illustrates a vertical parallel plate capacitor, wherein FIG. 10A illustrates a schematic circuit, FIG. 10B illustrates a top view, and FIG. 10C illustrates a perspective view.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in specific contexts, namely implemented in CMOS device applications. Embodiments of the invention may also be implemented in other semiconductor applications such as memory devices, logic devices, analog devices, power devices, radio frequency (RF) devices, digital devices, and other applications that utilize capacitors, for example.

Some properties of capacitors are a function of size. A larger amount of energy or charge may be stored by a capacitor the larger the capacitor plates are, for example. In some semiconductor device applications, it is desirable to decrease or scale the area of the capacitors on the chip. However, reducing the area of the capacitance may result in reduction in the capacitance of the capacitors or an increase in the failure rate of the capacitors. In various embodiments of the present invention, an improved integrated circuit with capacitors in series and parallel with enhanced reliability of the capacitor network, less area consumption and better capacitance stability is presented.

Figure 1:
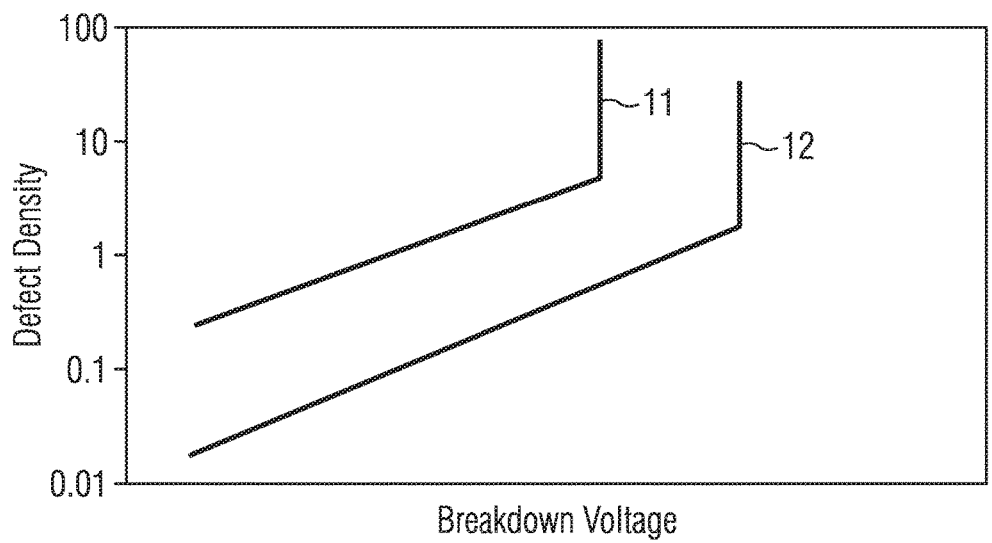
FIG. 1 illustrates a defect density associated failure of different capacitor structures.

FIG. 1 illustrates a defect density associated failure of different capacitor structures.

Failure rate targets for various technologies such as in automotive applications are increasingly becoming more stringent. For example, failure rates below 1 ppm are expected for many applications. On the other hand, higher voltages are used in CMOS technologies, which increase the propensity for failure. Back end of the line (BEOL) capacitors such as vertical parallel plate (VPP) capacitors, grid capacitors etc., have difficulty meeting these stringent reliability requirements solely by technological improvements because reliability may be determined by extrinsic defect density levels, which may not be controlled by the semiconductor device manufacturer. For example, a dust particle may become deposited onto the capacitive structure shorting the capacitors.

Referring to FIG. 1, break down characteristics of two different capacitors are illustrated using a first curve 11 and a second curve 12. The first curve 11 is representative of a capacitor have a first gap (separation between the plates of the capacitor) while the second curve 12 is representative of a capacitor having a second gap. In the illustration, the first gap of the first curve 11 is smaller than the second gap of the second curve 12. The shallower branches of the curves are related to extrinsic breakdowns, while the steeper part of the curves is due to intrinsic failures. Consequently, the first curve 11 fails at a higher defect density than the second curve 12 illustrating that the smaller gap distance has a higher probability of failure.

The use of stacked capacitors (capacitors connected in series) improves the reliability compared to a single capacitor. This is especially true for extrinsic defects. However, two capacitors stacked over each other have better failure rate than the single capacitor. The stacking of two capacitors may dramatically improve the failure rate. A single capacitor with a defect breaks and leads to a fail, whereas in a stacked capacitor design, all the capacitors have to be shorted before the capacitor stack fails. Therefore, the stacked capacitor is still functional if only one of the stacked devices fails. The probability of all the devices in the stack to fail is significantly lower and therefore the reliability is effectively improved. For example, a single capacitor with a failure rate of 100 ppm when stacked results in a capacitor having a failure rate of 0.01 ppm because the failure rate of the stack is the product of the failure rate of each single capacitor. Additionally by stacking the intrinsic reliability of the capacitors are improved, since only half of the voltage is applied to the single capacitor in series.

Figure 2A:
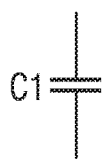
FIGS. 2A-2C, illustrates schematics of stacking capacitors.
Figure 2B:
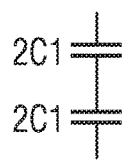
Figure 2C:
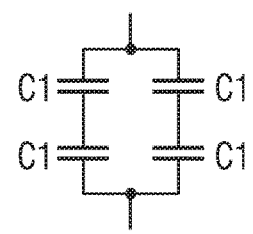

FIG. 2, which includes FIGS. 2A-2C, illustrates schematics of stacking capacitors in accordance with an embodiment of the present invention.

FIG. 2A illustrates the reference single capacitor that is being redesigned to a stacked capacitor. The stacking of two capacitors in series may result in a larger area consumption if the spacing (i.e. the specific area capacitance) of one capacitor is maintained. However, when the two capacitors having a capacitance "C1" are stacked, the effective capacitance reduces to C1/2. To compensate, as illustrated in FIG. 2B, the area of each of the capacitor has to be increased so that each individual capacitor in the stack has capacitance of "2C1," which when stacked result in an effective capacitance of C1. However, this stacked capacitor has an area, which is larger by a factor of four than the single capacitor having the capacitance "C1". Similarly, another option is to stack two of the capacitors in series and add a parallel stack. If each capacitor has a capacitance of "C1," the resulting capacitor array has an effective capacitance of C1 while still taking up four times the area of the single capacitor of FIG. 2A.

Additionally, the capacitance of the stacked capacitor changes when one of the capacitor in the stack breaks down. For example, in FIG. 2B, if a single capacitor fails, the resulting capacitance of the stacked capacitor changes from "C1" to "2C1." Similarly, in FIG. 2C, if a single capacitor fails, the resulting capacitance of the stacked capacitor changes from "C1." to "1.5C1."

In various embodiments, the increase of the total area can be compensated by the reduced isolation thickness as will be described further below. In various embodiments, capacitor stacks immune to variation in capacitance value due to failure will be described using a pixel based capacitor structure design.

Figures 3, 4:
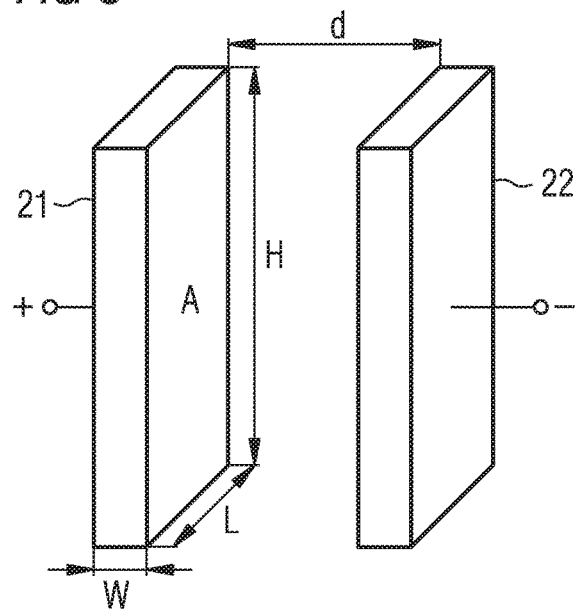
FIG. 3 illustrates a capacitor structure for understanding an embodiment of the present invention.
FIG. 4 illustrates a table for understanding an embodiment of the present invention.

FIG. 3 illustrates a capacitor structure for understanding an embodiment of the present invention.

Referring to FIG. 3, a capacitor having a first plate 21 and a second plate 22 is illustrated. Each of the plates of the capacitor have a height H, a length L, and a width W. The first plate 21 is separated from the second plate 21 by a separation d. The areal foot print of the capacitor ($A_{FP}$) over a substrate (foot print on chip) is a product of the length and a sum of the distance and width, i.e., $A_{FP}=L\times(d+W)$. In contrast, the capacitance of the capacitor is directly proportional to the product of the height and length while being inversely proportional to the separation d.

In accordance with an embodiment, if the length L and the separation d are simultaneously scaled by the same amount (scaling factor SF), the capacitance of the capacitor is identical to the capacitance of the larger capacitor. However, the areal foot print of the capacitor ($A_{FP}$) is now scaled by a square of the scaling factor ($SF^2$). The reduction in the length of the capacitor plate L will also reduce the parasitic capacitance. When this scaled capacitor is used in a capacitor design such as in FIG. 2C, the effective capacitance of the capacitor is maintained without increasing the area if each capacitor is scaled by around 0.5. Scaling to a lower spacing will clearly increase the failure rate of the single capacitor, but the overall failure rate (product of single failure rates) will nevertheless decrease as explained above.

FIG. 4 illustrates a table for understanding an embodiment of the present invention.

FIG. 4 summarizes an alternative embodiment of the present invention, which generalizes the above idea. Unlike the prior embodiment, this embodiment provides a near constant capacitance even if a single capacitor fails.

Referring to FIG. 4, the table illustrates three examples. The second column is the standard single capacitor, which is being replaced with the alternative designs in the third and the fourth columns but keeping the same total capacitance value. The third column illustrates the characteristic of a 2×2 capacitor array having two columns of capacitors coupled in parallel. Such an symmetric array is susceptible to drift if one of the capacitor fails. For example, when one capacitor fails, the effective capacitance increases to 1.5 C. In contrast, the fourth column illustrates a multi-dimensional array in which each capacitor is scaled by a scaling factor (m/n), where m is the number of elements in a column and where n is the number of elements in a row. In the particular example, the number of elements in a column m is 2 while the number of elements in a row is generalized. Thus, the effective capacitance of the array is maintained at C. However, even if one of the capacitor fails, the capacitor array does not drift significantly. The effective capacitance after one failure of the multi-dimensional array is $(C/n)\times(1-n+nm)/(m-1)$. For the illustrated example, this effective capacitance after one failure becomes $(n+1)C/n$ when the number of elements in a column m is equal to 2. When the number of rows is large, for example, greater than 100, the change in capacitance is only 1%. Even when number of rows is 20, the change in capacitance is only 5%. Similarly, when the number of elements in a row is restricted to 2, the effective capacitance after one failure becomes $(C/2)\times(2m-1)/(m-1)$. For example, when the number of elements in a column is large, for example, greater than 100, the change in capacitance is only 0.5%.

Additionally as shown in the last row of the table, the failure probability drops dramatically as the failure depends on the product of the probability of a single failure. For a stack of two devices (as in the illustration), both capacitor elements in the stack have to fail. The probability of both devices to fail is the product of the probability of an individual device to fail. Therefore, stacking the devices dramatically reduces the failure rate.

Accordingly, in various embodiments, it is advantageous to replace a single capacitor with an array of scaled capacitors, each of the scaled capacitor in the array having a smaller capacitance. However, this smaller capacitance is carefully selected so that the capacitor array has the same capacitance as the single capacitor being replaced.

In various embodiments, a pixelated capacitor incorporating the ideas of FIGS. 3 and 4 will be described using FIGS. 5-10.

FIG. 5, which includes FIGS. 5A-5D, illustrates a capacitor array illustrating a multi-dimensional array in accordance with an embodiment of the present invention, wherein FIG. 5A illustrates a circuit layout, wherein FIG. 5B illustrates a top view of the capacitor array, and wherein FIGS. 5C and 5D illustrate cross-sectional views of the capacitor array.

FIG. 5A illustrates a capacitor array having a plurality of capacitor elements comprising a first element C11, a second element C12, a third element C21, a fourth element C22, a fifth element C31, a sixth element C32, and so on. In various embodiments, the capacitor array is coupled between a first potential node V1 and a second potential node V2. In various embodiments, as described previously, the various elements of the capacitor array such as the first element C11, a second element C12, a third element C21, a fourth element C22, a fifth element C31, a sixth element C32 have the same capacitance. In general this concept of stacking and pixeling can be used with different types of capacitors (not only VPP capacitors) having also different capacitance values based on circuit requirements, for example a MOSCAP or a MIM-CAP may be stacked with a VPP capacitor.

The schematic of FIG. 5A may be implemented in a vertical parallel plate capacitor as illustrated in FIG. 5B in one or more embodiments. FIG. 5B illustrates a vertical parallel plate capacitor having a first plurality of metal lines 30, a second plurality of metal lines 40, a third plurality of metal lines 50 arranged along a same direction. The first plurality of metal lines 30 is coupled to a first vertical line 60 while the second plurality of metal lines 40 is coupled to a second vertical line 70. In various embodiments, the third plurality of metal lines 50 is floating and is not coupled to any fixed potential node. Thus each line of the third plurality of metal lines 50 is disposed between a line of the first plurality of metal lines 30 and a line of the second plurality of metal lines 40. Accordingly, the first vertical line 60 is coupled to a via after crossing over three metal lines (one of the second plurality of metal lines 40 and two of the third plurality of metal lines 50). Similarly, the second vertical line 70 is coupled to a via after crossing over three metal lines (one of the first plurality of metal lines 30 and two of the third plurality of metal lines so).

The embodiment illustrated in FIG. 5B illustrates maximizing the pixeling aspect of the capacitor array. For example, to short a single stack (e.g., comprising the first element C11 and the second element C12), a defect has to extend from a metal line of the first plurality of metal lines 30 to the second plurality of metal lines 40. A defect shorting only adjacent metal lines such as a metal line of the first plurality of metal lines 30 and a metal line of the third plurality of metal lines 50 does not short both the first element C11 and the second element C12.

However, in this embodiment, the capacitors of the first element C1 and the second element C12, which are coupled to the first plurality of metal lines 30 and the second plurality of metal lines 40 are next to each other. Therefore, a short may be formed by a defect having a first length L1.

Advantageously, using this pixeling approach, drift of the capacitance of the capacitor array is avoided even if one of the individual capacitor elements fails.

FIGS. 5C and 5D illustrate cross-sectional views of the capacitor array in accordance with an embodiment of the present invention, wherein FIG. 5C illustrates a cross-sectional view along the first vertical metal line while FIG. 5D illustrates a cross-sectional view along the second vertical metal line.

The capacitor array may comprise a large number of metal levels or metallization layers in various embodiments. Only as an illustration seven metal levels are illustrated in FIGS. 5C and 5D. More or less number of metal levels may be used in various embodiments. As illustrated, the capacitor array may be formed over a workpiece 100. In various embodiments, the workpiece 100 may be a semiconductor substrate. The workpiece 100 may include a semiconductor substrate comprising silicon or other semiconductor materials covered by an insulating layer, for example. The workpiece 100 may comprise silicon oxide over single-crystal silicon, for example. In one or more embodiments, compound semiconductors, GaAs, InP, Si/Ge, or SiC, as examples, may be used in place of silicon. The workpiece 100 may comprise a silicon-on-insulator (SOI) substrate or other substrates like glass, printed circuit board, for example.

The workpiece 100 may also include other active components or circuits, not shown. The workpiece 100 may include other conductive layers or other semiconductor elements, e.g., transistors, diodes, etc., not shown.

The workpiece 100 may comprise different regions. For example, the workpiece 100 may comprise a capacitor region as illustrated in FIG. 5C but may also include other interconnect regions. A vertical parallel plate capacitor is formed in the capacitor region of the workpiece 100 while a plurality of interconnects (conductive lines and vias) for interconnecting other elements of the workpiece may be formed in other regions.

As illustrated, the capacitor array may be formed within an insulating layer 101. In practice, the insulating layer 101 comprises a plurality of insulating layers or inter level dielectric layers that may be separated by etch stop layers. Each inter level dielectric layer may further comprise a plurality of layers.

A first conductive material layer $M_1$ is formed over the workpiece 100. In various embodiments, a damascene process may be used to form the first conductive material layer $M_1$. A first insulating material 101a is formed over the workpiece 100. The first insulating material 101a may comprise about 1,000 to 4,000 Angstroms, or about 5,000 Angstroms or less, of an oxide such as $SiO_2$, a nitride such as $Si_3N_4$, a low-k dielectric material having a dielectric constant less than about 3.9, a capping layer, a liner, an etch stop layer, or combinations and multiple layers thereof, as examples. Alternatively, the first insulating material 101a may comprise other dimensions and materials, for example. The first insulating material 101a may be formed using chemical vapor deposition (CVD), atomic layer deposition (ALD), metal organic chemical vapor deposition (MOCVD), physical vapor deposition (PVD), a spin-on process, or jet vapor deposition (JVD), as examples, although alternatively, other methods may also be used.

The first insulating material 101a is patterned with a pattern for a plurality of first parallel conductive members 112. The patterned first insulating material 101a is filled with a conductive material to fill the patterns, and excess conductive material is removed from the top surface of the first insulating material 101a, using an etch process and/or a chemical-mechanical polish (CMP) process, for example, leaving the plurality of first parallel conductive members 112 formed within the first insulating material 101a. The conductive material may comprise one or more conductive liners and a fill material formed over the liner, for example. The liner(s) may comprise Ta, TaN, WN, WCN, Ru, Ti, TiN, TiSiN, other materials, or combinations thereof, and the fill material may comprise Al, Cu, W, Ag, other metals, a semiconductive material, or combinations thereof, as examples.

Alternatively, the first conductive material layer $M_1$ may be formed using a subtractive etch process. For example, a conductive material may be formed over the workpiece 100, and the conductive material may be subtractively etched to form the plurality of first parallel conductive members 112. The first insulating material 101a is then deposited between the plurality of first parallel conductive members 112.

Next, a second conductive material layer $V_1$ is formed over the first conductive material layer $M_1$. The second conductive material layer $V_1$ comprises a via layer or a via level in a multi-layer interconnect of the capacitor array. A single or dual damascene process (e.g., in which second parallel conductive members 113 are also formed) may be used to form the second conductive material layer $V_1$, for example. Alternatively, a subtractive etch process may be used.

For example, in a single damascene process, a second insulating material 101b is formed over the first conductive material layer $M_1$. The second insulating material 101b may comprise similar materials and dimensions and may be formed using similar methods as described for the first insulating material 101a, for example. The second insulating material 101b is patterned with a pattern for a plurality of first vias 122 over each of the plurality of first parallel conductive members 112 using a lithography process. The patterned second insulating material 101b is filled with a conductive material to fill the patterns, and excess conductive material is removed from the top surface of the second insulating material 101b using a CMP and/or etch process. A conductive liner may be formed over the patterned second insulating material 101b before filling the patterns for the plurality of vias 122. The conductive material and conductive liner may comprise the same materials as described for the first conductive material layer $M_1$, for example.

A third conductive material layer $M_2$ is formed over the second conductive material layer $V_1$. The third conductive material layer $M_2$ may comprise a metallization layer for conductive lines 113. To form the third conductive material layer $M_2$, a damascene process may be used. A third insulating material low is formed over the second insulating material 101b. The third insulating material low may comprise similar materials and dimensions as described for the first insulating material 101a, for example. The third insulating material low is patterned with a pattern for a plurality of second parallel conductive members 113. The patterned third insulating material low is filled with a conductive material to fill the patterns, and excess conductive material is removed from the top surface of the third insulating material low, using a CMP and/or etch process. Alternatively, the third conductive material layer $M_2$ may be formed using a subtractive etch process.

In alternative embodiments, the second conductive material layer $V_1$ and the third conductive material layer $M_2$ may also be formed using a dual damascene process, wherein a single insulating material layer 101b/101c is formed over the first insulating material 101a. A first lithography mask is used to pattern the plurality of first vias 122, and a second lithography mask is used to pattern the second parallel conductive members 113. The patterns in the insulating material 101b/101c are then filled simultaneously with a conductive material.

Subsequent metal levels and via levels may be formed as described above. Thus, a plurality of second vias 123 are formed in a fourth insulating material mid, a plurality of third parallel conductive members 114 are formed in a fifth insulating material 101e, a plurality of third vias 124 are formed in a sixth insulating material 101f, a plurality of fourth parallel conductive members 115 are formed in a seventh insulating material 101g, a plurality of fourth vias 125 are formed in a eighth insulating material 101h, a plurality of fifth parallel conductive members 116 are formed in a ninth insulating material 101h, a plurality of fifth vias 126 are formed in a tenth insulating material 101j, a plurality of sixth parallel conductive members 117 are formed in a eleventh insulating material 101k, a plurality of sixth vias 127 are formed in a twelfth insulating material 101l, a plurality of seventh parallel conductive members 118 are formed in a thirteenth insulating material 101m.

The first, the second, and the third plurality of metal lines 30, 40, and 50 illustrated in FIG. 5B are illustrated in FIGS. 5C and 5D for clarification. Thus, the first plurality of metal lines 30 may be a metal line from each one of the metal levels. The nomenclature of the first, the second, and the third plurality of metal lines 30, 40, and 50 is based on the subsequent connection with a potential node or absence thereof (floating).

FIG. 6, which includes FIGS. 6A-6B, illustrates a capacitor array illustrating locally separated capacitors within a series circuit in accordance with an alternative embodiment of the present invention, wherein FIG. 6A illustrates a schematic layout and FIG. 6B illustrates a top view.

In this embodiment, the first element C11 and the third element C21 are disposed proximate each other. Similarly, the second element C12, the fourth capacitor C22, and a sixth capacitor C32 are disposed next to each other. Thus, the capacitor array is susceptible to shorting only between the second element C12 and the third element C21.

Referring to FIG. 6B, a third metal line 65 may couple to the third plurality of metal lines 50 using vias as described before. Further, the first plurality of metal lines 30 and the second plurality of metal lines 40 are locally separated into two separate regions, a first region R1 and a second region R2 over the workpiece 100. The first region R1 includes the first element C11, the third element C21 as well as other such elements while the second region R2 includes the second element C12, the fourth element C22, the sixth element C32, and so on.

Referring to FIG. 6A, the capacitor array of this embodiment is more immune to shorting by defects. As described above, in this embodiment, the first plurality of metal lines 30 are separated from the second plurality of metal lines 40 as much as possible. Therefore, except the third element C21 and the second element C12, the other capacitors are separated. For example, in FIG. 6B, a defect D1 formed over the second plurality of metal lines 40 and the third plurality of metal lines 50 may not be able to short a capacitor element between the first plurality of metal lines 30 and the third plurality of metal lines 50 as well as a capacitor element between the second plurality of metal lines 40 and the third plurality of metal lines 50. Thus, as illustrated by the defect D2, only a particular location of the defect may short the two capacitors. Consequently, this reduces the probability of both capacitors being shorted dramatically.

Figure 7A:
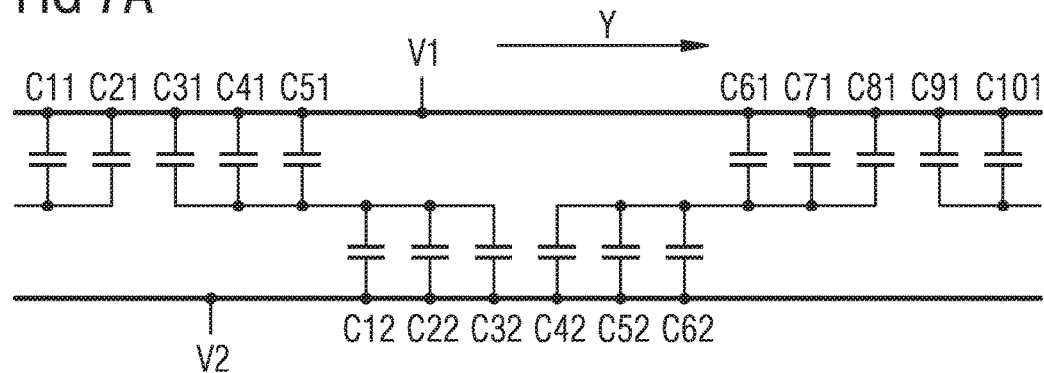
Figure 7B:
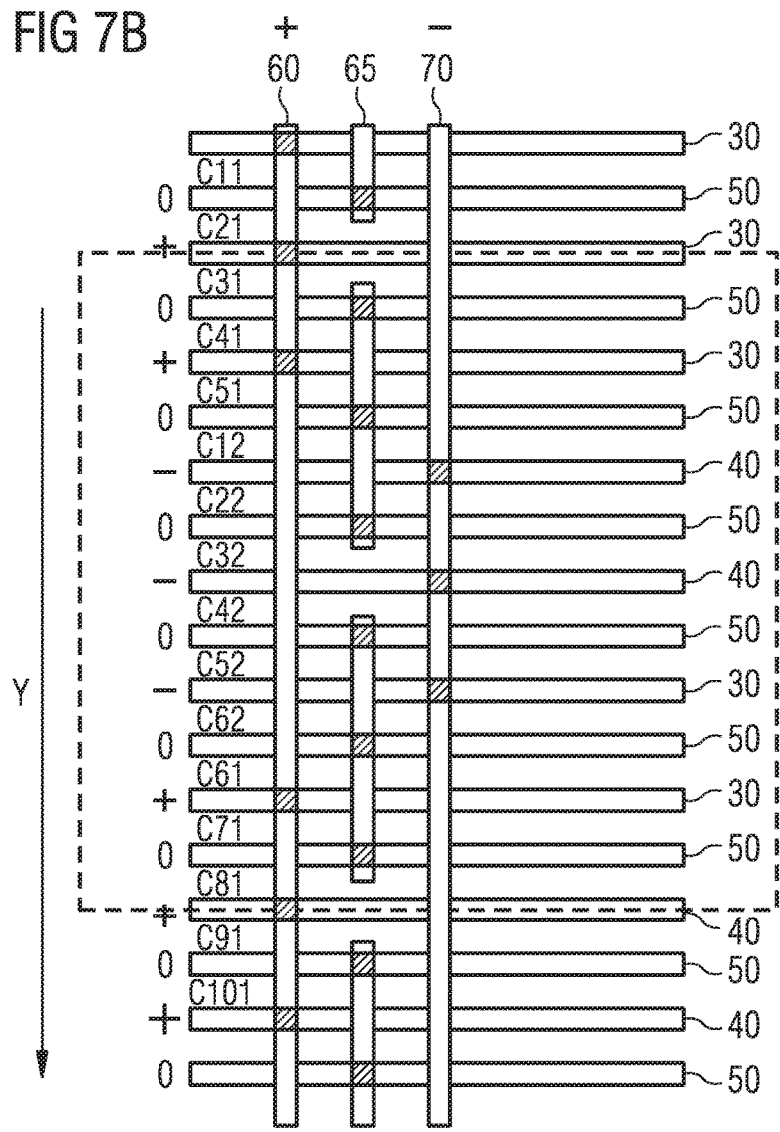

FIG. 7, which includes FIGS. 7A-7B, illustrates a capacitor array illustrating both pixeling and locally separated capacitors within a series circuit in accordance with an alternative embodiment of the present invention, wherein FIG. 7A illustrates a schematic layout and FIG. 7B illustrates a top view.

This embodiment combines the embodiments described in FIGS. 5 and 6. Thus, in this embodiment, a few capacitors are grouped together. For example, as illustrated in FIGS. 7A and 7B, a first set of capacitor elements (C11, C21, C31, C41, C51) are formed together. A second set of capacitor elements (C12, C22, C32, C42, C52, and C62) are formed together. The series repeats with a third set of capacitor elements (C61, C71, C81, C91, and C101). The odd series of capacitor elements are coupled between the first potential node V1 and the intermediate potential while the even set of capacitor elements (C12, C22, C32, C42, C52, C62) are formed between the second potential node V2 and the intermediate potential. Further, to improve reliability, each set of capacitor elements is sub-divided as illustrated in the layout of FIG. 7B.

Referring to FIG. 7B, the third metal line 65 is interrupted after every few connections. In various embodiments, the third metal line 65 is not a continuous single line. Rather, the third metal line 65 comprises a plurality of line segments. The line segments may connect a selected number of capacitor elements. In one embodiment, the line segments may be collinear. In another embodiment, the line segments may be staggered. For example, in FIG. 7B, each line segment of the third metal line 65 couples to only three metal lines of the third plurality of metal lines 50. In alternative embodiments, each line segment of the third metal line 65 may couple to two or four or five metal lines of the third plurality of metal lines 50.

This pattern comprising the twelve capacitors repeats again (see also dashed rectangle in FIG. 7B).

FIG. 8, which includes FIGS. 8A-8B, illustrates a capacitor array illustrating more than two capacitors in series in accordance with an alternative embodiment of the present invention, wherein FIG. 8A illustrates a schematic layout and FIG. 8B illustrates a top view.

In various embodiments, more than two capacitors may be stacked in series. For example, the embodiments described in FIGS. 5-7 may comprise more than two capacitor elements in series. As an illustration, in this embodiment, the embodiment of FIG. 5 is modified to include three capacitors in series. In one or more embodiments, this may be accomplished by modifying the location of the vias under the first vertical metal line 60 and the second vertical metal line 70.

Consequently, in this embodiment, two floating metal lines are formed. As illustrated in FIG. 8B, a third plurality of metal lines 50 and a fourth plurality of metal lines 45 are floating and are therefore not directly electrically coupled to any fixed potential node. Thus, in this embodiment, each series has three capacitors. For example, a first element C11, a second element C21, and a third element C31 forms a first column. A fourth element C21, a fifth element C22, and a sixth element C32 form a second column while a seventh element C31, an eighth element C32, and a ninth element C33 form a third column, and so on.

Figure 9C:
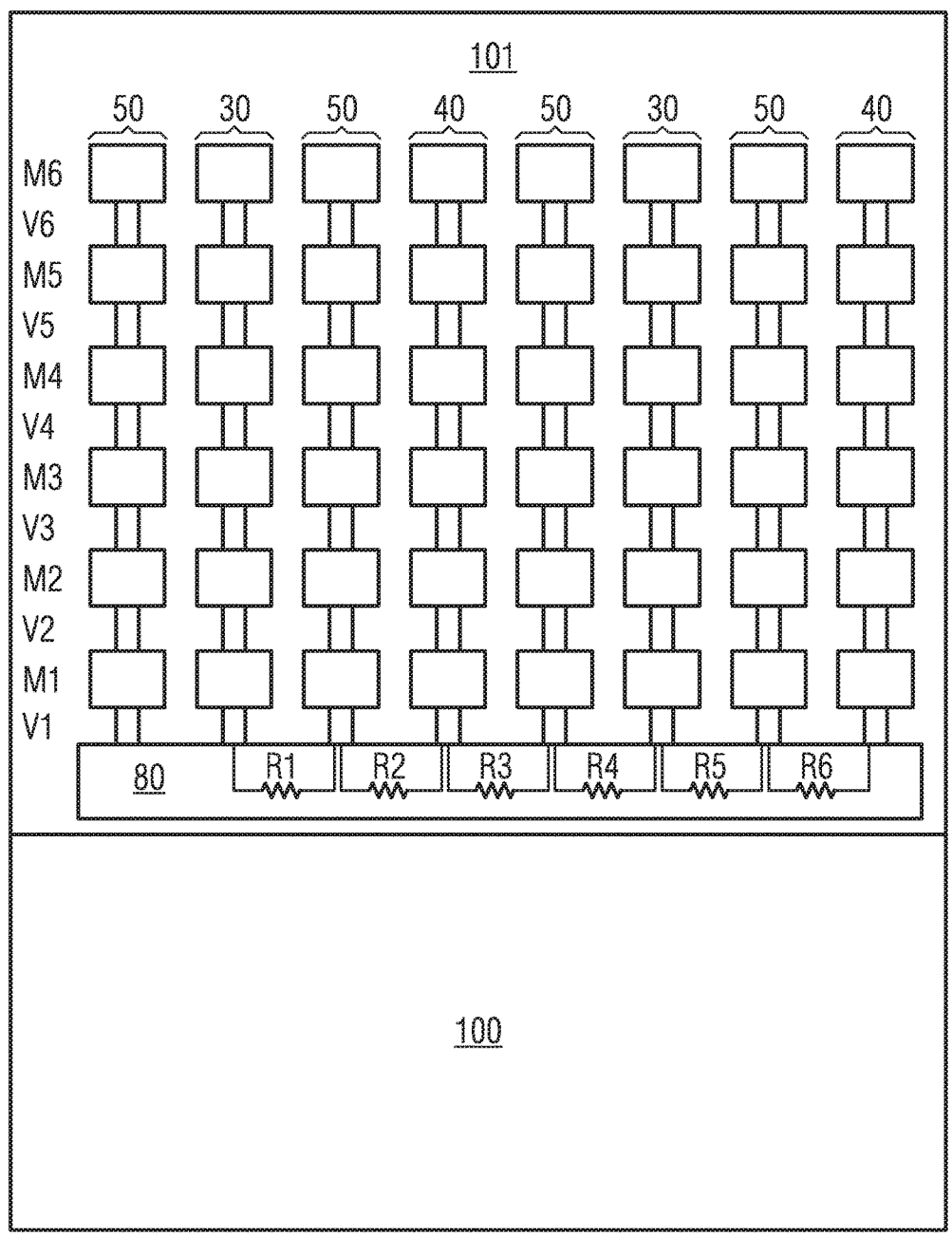

FIG. 9, which includes FIGS. 9A-9C, illustrates a capacitor array illustrating clamping of the floating potential in accordance with an alternative embodiment of the present invention, wherein FIG. 9A illustrates a schematic layout, FIG. 9B illustrates a top view, and FIG. 9C illustrates a cross-sectional view.

Referring to FIG. 9A, in various embodiments, the previously described embodiments, for examples, FIGS. 4-8 may be further modified to convert the floating nodes to be have fixed potential. For example, the potential of the floating nodes may be fixed to a mid-potential between the first potential node V1 and the second potential node V2. This may be accomplished by adding a first resistor R1 between the first potential node V1 and the floating node and a second resistor R2 between the second potential node V2 and the floating node. In various embodiments, the resistors may be implemented using a poly silicon line 80 (FIGS. 9B and 9C) under the metallization layers.

Accordingly in various embodiments, reliability of capacitors may be greatly improved by stacking without a significant increase in area consumption on the chip. In various embodiments, advantageously, breakdown of a few capacitors has no significant drift in the capacitance value of the capacitor array because of the pixeling of stacked capacitors. This makes the use of stacked capacitors very attractive compared to a stacked capacitor without pixeling. Embodiments of the invention may be implemented without an increase in design cost of manufacturing costs due to the simple connecting scheme. In various embodiments, parallel and serial (stacked) circuits of vertical parallel plate capacitor array may be implemented without additional area consumption. Advantageously, in various embodiments, the connecting scheme may be changed by just changing of two metallization layers (e.g., upper most metal line and via).

Figure 10A:
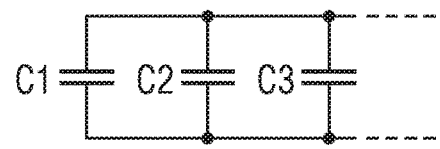
Figure 10B:
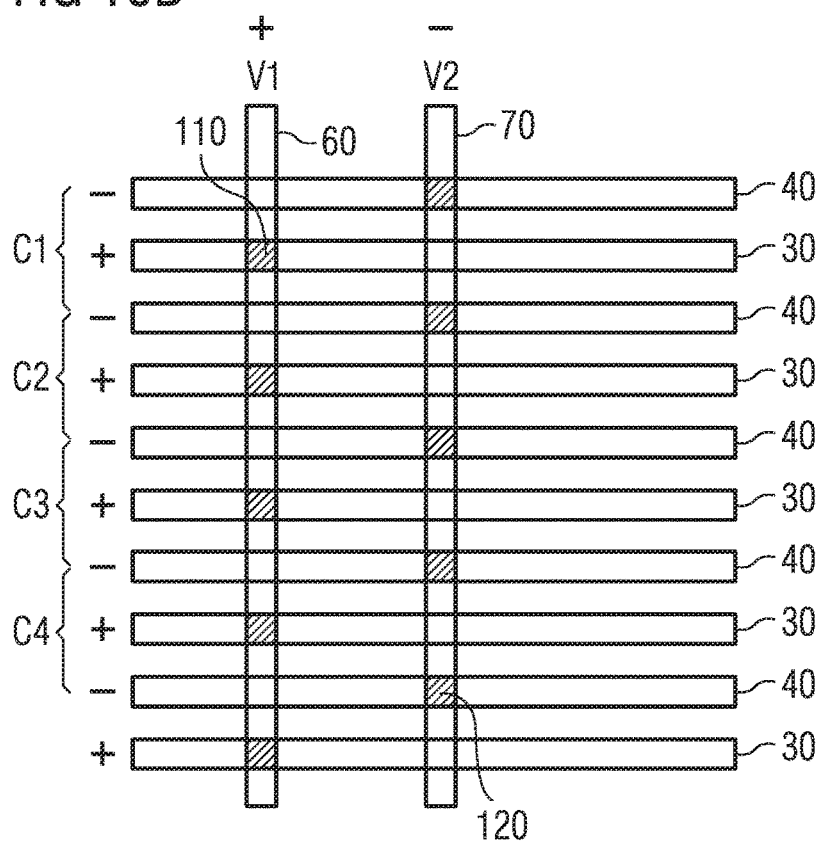
Figure 10C:
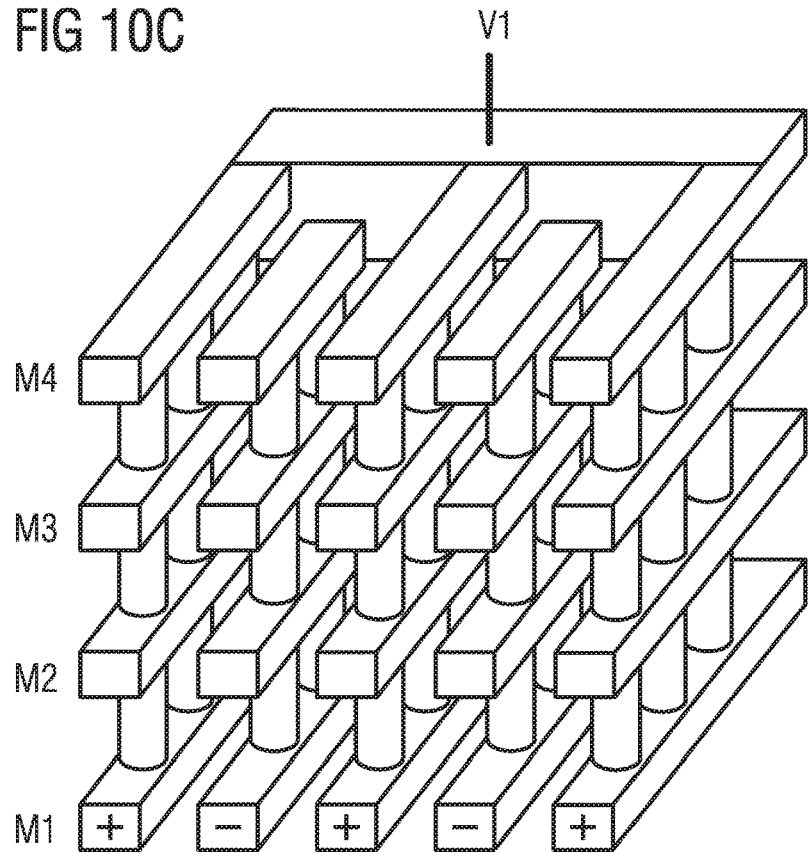

FIG. 10, which includes FIGS. 10A-10C, illustrates a vertical parallel plate capacitor, wherein FIG. 10A illustrates a schematic circuit, FIG. 10B illustrates a top view, and FIG. 10C illustrates a 3D perspective view. As shown in FIG. 10C the last metal layer can be used to connect the single metal lines below and also used as part of the vertical capacitor plates.

The capacitor may be formed by arranging a plurality of capacitors in parallel as illustrated in FIG. 10A. This is implemented by alternate arrangement of first plurality of metal lines 30 and second plurality of metal lines 40. The first plurality of metal lines 30 are coupled to a first vertical metal line 60 while the second plurality of metal lines 40 are coupled to a second vertical metal line 70.

As described in various embodiments, the vertical parallel plate capacitor illustrated in FIG. 10 may be replaced with a capacitor array in accordance with the embodiments of the present invention described in FIGS. 1-9.

Figure 11:
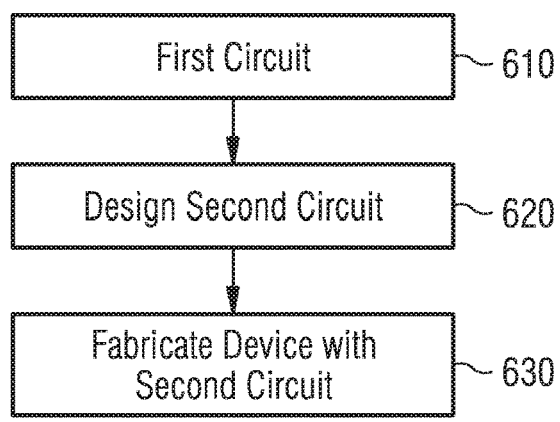
FIG. 11 illustrates applying embodiments of the present invention.

FIG. 11 illustrates an embodiment of the present invention applying embodiments of the invention.

Referring to FIG. 11, box 610, the first circuit is provided, which may be the circuit illustrated in FIG. 10. The first circuit is converted to a second circuit having a capacitor array as described in box 620. Next, the second circuit is fabricated using semiconductor processing as described in box 630.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 5-9 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A capacitor comprising:
   a first row comprising a first capacitor element and a second capacitor element coupled in parallel; and a second row comprising a third capacitor element and a fourth capacitor element coupled in parallel, wherein the first row is coupled in series with the second row, wherein, in a metallization level over a workpiece, the second capacitor element is disposed between the first capacitor element and the third capacitor element, wherein, in the metallization level, the third capacitor element is disposed between the second capacitor element and the fourth capacitor element, wherein the first, the second, the third, and the fourth capacitor elements are disposed in the metallization level.

2. The capacitor of claim 1, wherein the first, the second, the third, and the fourth capacitor elements have a same first capacitance.

3. The capacitor of claim 1, wherein the first row comprises a fifth capacitor element coupled in parallel to the first and the second capacitor elements, wherein the second row comprises a sixth capacitor element coupled in parallel to the third and the fourth capacitor elements.

4. The capacitor of claim 3, wherein the first row comprises a fifth capacitor element coupled in parallel to the first and the second capacitor elements, wherein the fourth capacitor element is disposed between the third capacitor element and the fifth capacitor element.

5. The capacitor of claim 1, wherein the capacitor is a vertical parallel plate capacitor array.

6. The capacitor of claim 1, wherein the first capacitor element comprises a first metal line and a second metal line, wherein the second capacitor element comprises the second metal line and a third metal line, wherein the first metal line of the first capacitor element is coupled to the third metal line of the second capacitor element by a first vertical metal line oriented in a direction perpendicular to first and the third metal lines of the first and the second capacitor elements.

7. A method of forming a capacitor, the method comprising:
   forming a first row comprising a first capacitor element and a second capacitor element coupled in parallel; and
   forming a second row comprising a third capacitor element and a fourth capacitor element coupled in parallel, wherein the first row is coupled in series with the second row, wherein, in a metallization level over a workpiece, the second capacitor element is disposed between the first capacitor element and the third capacitor element, wherein, in the metallization level, the third capacitor element is disposed between the second capacitor element and the fourth capacitor element, wherein the first, the second, the third, and the fourth capacitor elements are disposed in the metallization level.

8. The method of claim 7, wherein the first, the second, the third, and the fourth capacitor elements have a same first capacitance.

9. The method of claim 7, wherein the first row comprises a fifth capacitor element coupled in parallel to the first and the second capacitor elements, wherein the second row comprises a sixth capacitor element coupled in parallel to the third and the fourth capacitor elements.

10. The method of claim 9, wherein the first row comprises a fifth capacitor element coupled in parallel to the first and the second capacitor elements, wherein the fourth capacitor element is disposed between the third capacitor element and the fifth capacitor element.

11. The method of claim 7, wherein the capacitor is a vertical parallel plate capacitor array.

12. The method of claim 7, wherein the first capacitor element comprises a first metal line and a second metal line, wherein the second capacitor element comprises the second metal line and a third metal line, wherein the first metal line of the first capacitor element is coupled to the third metal line of the second capacitor element by a first vertical metal line oriented in a direction perpendicular to first and the third metal lines of the first and the second capacitor elements.

* * * * *